(12) United States Patent
Chikuan et al.

(10) Patent No.: US 6,694,818 B2
(45) Date of Patent: Feb. 24, 2004

(54) PRESSURE SENSOR HAVING SEMICONDUCTOR SENSOR CHIP

(75) Inventors: Kenji Chikuan, Kariya (JP); Michitake Kuroda, Ama-gun (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/904,898

(22) Filed: Jul. 16, 2001

(65) Prior Publication Data
US 2002/0023500 A1 Feb. 28, 2002

(30) Foreign Application Priority Data
Aug. 25, 2000 (JP) ........................................ 2000-255908

(51) Int. Cl.[7] ................................................ G01L 7/08
(52) U.S. Cl. ............................. 73/715; 73/720; 73/727
(58) Field of Search .......................... 73/715, 261, 720; 437/209

(56) References Cited

U.S. PATENT DOCUMENTS 5,595,939 A * 1/1997 Otake et al. ................ 437/209
6,116,092 A * 9/2000 Ohmi et al. ................. 73/715
6,212,955 B1 * 4/2001 Tanaka et al. .............. 73/718

FOREIGN PATENT DOCUMENTS

JP A-10-122997 5/1998

* cited by examiner

Primary Examiner—Edward Lefkowitz
Assistant Examiner—Alandra N. Ellington
(74) Attorney, Agent, or Firm—Posz & Bethards, PLC

(57) ABSTRACT

A semiconductor sensor chip is interposed between a sensor case and a housing. A first pressure is introduced from the sensor case and applied to a rear surface of the sensor chip, while a second pressure is introduced from the housing and applied to a front surface of the sensor chip. The sensor chip detects a pressure difference between the first and the second pressures and converts it into an electrical signal. The sensor chip is hermetically mounted in a depressed portion formed in the sensor case by charging a sealing material from holes formed around the depressed portion. The charging holes are positioned between terminals electrically connecting the sensor chip to an outside circuit to avoid enlarging the pressure sensor size by forming the charging holes.

12 Claims, 4 Drawing Sheets

PRESSURE SENSOR HAVING SEMICONDUCTOR SENSOR CHIP

CROSS-REFERENCE TO RELATED APPLICATION

This application is based upon and claims benefit of priority of Japanese Patent Application No. 2000-255908 filed on Aug. 25, 2000, the content of which is incorporated herein by reference.

BACKGROUND OF THE INVENTION

1. Field of the Invention

The present invention relates to a pressure sensor having a semiconductor sensor chip, such as an oil pressure sensor for use in an automotive vehicle.

2. Description of Related Art

An example of a pressure sensor of this kind is disclosed in JP-A-7-243926. In this pressure sensor, a semiconductor sensor chip is mounted via a substrate on a depressed portion formed in a case. The depressed portion is filled with oil to cover the sensor chip, and the oil is hermetically covered with a metallic seal diaphragm. A pressure to be measured is imposed on a front surface of the seal diaphragm, and the imposed pressure is transferred to the semiconductor chip via the oil covering the semiconductor sensor chip. That is, the pressure to be measured by the semiconductor chip is imposed thereon from the front surface of the seal diaphragm which is opposite to the substrate of the sensor chip. This type of the pressure sensor is called a front-surface-type pressure sensor.

A pressure sensor in which the pressure to be measured is imposed on the rear surface of the sensor chip (a rear-surface-type pressure sensor) is also required to meet a certain pressure-sensing arrangement. A rear-surface-type pressure sensor made by the inventors as a proto-type is shown in FIG. 5. FIG. 5 briefly shows the front surface side of the sensor chip. A sensor chip J2 is mounted in a depressed portion J4 formed on one end surface J3 of a sensor case J1. Four terminals J5 for connecting the sensor ship J2 to an outside circuit are disposed around the depressed portion J4. The terminals J5 are molded in the sensor case J1 so that they extend in a longitudinal direction of the sensor case from one end surface of the sensor case (the front surface side) toward the other end surface.

The sensor chip J2 is a semiconductor sensor chip having a diaphragm and is pasted on the bottom surface of the depressed portion J4 via a sensor chip substrate. A through-hole J6 is formed in the sensor case J1, so that a pressure to be measured is imposed on the sensor chip diaphragm through the through-hole J6. The sensor chip J2 is disposed in the depressed portion J4 to hermetically close the front side opening of the through-hole J6. The rear-surface-type pressure sensor that senses a pressure supplied from the rear surface of the sensor chip is made in this manner. Further, the front surface of the sensor chip may be covered with oil and a seal diaphragm in the same manner as in the pressure sensor disclosed in aforementioned JP-A-7-243926, and another pressure may be supplied to the front surface of the sensor chip from the seal diaphragm side. In this manner, a pressure difference between the pressure supplied to the rear surface and the pressure supplied to the front surface may be detected by the sensor chip.

In the pressure sensor structure shown in FIG. 5, it is necessary to hermetically seal a boundary of the sensor chip J2 and the opening of the through-hole J6 to avoid pressure leakage through the boundary. For this purpose, it is effective to fill a space J7 between the sensor chip J2 and inner walls of the depressed portion J4 with a sealing material such as resin. However, the space J7 has to be sufficiently large to effectively fill the space J7 with a viscous sealing material. The depressed portion J4 could be enlarged as shown with a dotted line in FIG. 5. However, if the depressed portion J4 is enlarged, the terminals J5 must be moved further outside. This causes a problem that an entire size of the sensor case J1 has to be made large.

SUMMARY OF THE INVENTION

The present invention has been made in view of the above-mentioned problem, and an object of the present invention is to provide an improved pressure sensor, in which a pressure to be measured is supplied to a rear surface of a sensor chip through a through-hole formed in a sensor case, and a sensor chip is hermetically connected to the through-hole without enlarging the pressure sensor size. Another object of the present invention is to provide a compact pressure sensor that detects a pressure difference between pressures applied to both surfaces of the sensor chip.

The pressure sensor is composed of a cylindrical sensor case and a housing, both connected to each other by calking one end of the housing. A depressed portion is formed on one longitudinal end surface of the sensor case, where the sensor case is coupled with the housing. A semiconductor sensor chip having a front surface and a rear surface is mounted in the depressed portion so that the front surface faces the housing. A first pressure is imposed on the rear surface of the sensor chip through a through-hole formed in the sensor case. A second pressure introduced from the housing is imposed on the front surface of the sensor chip via oil confined to cover the front surface. The sensor chip detects a pressure difference between the first and the second pressures and converts the detected pressure difference into an electric signal.

The sensor chip has to be hermetically mounted in the depressed portion so that the first pressure does not leak to the second pressure side. For this purpose, a sealing material is charged into a space between a sidewall of the depressed portion and a side periphery of the sensor chip. Plural holes for charging the sealing material are formed around the depressed portion. The charging holes are positioned between terminals electrically connecting the sensor chip to an outside circuit. In this manner, the charging holes are formed without enlarging the sensor case size.

Preferably, the depressed portion is formed in a rectangular shape, and the charging holes are formed at four corners of the rectangular depressed portion. In this manner, the sealing material is uniformly and smoothly charged in the charging space. The sensor chip is hermetically mounted on the sensor case to prevent the first pressure leakage to the second pressure side. Further, a tapered slope outwardly enlarging the charging hole is added to the charging hole. The sealing material further smoothly flows along the tapered slope into the charging space.

Alternatively, the sensor chip may detect only the first pressure imposed on the rear surface thereof by eliminating the second pressure supply from the housing side. In this case, the pressure sensor functions as an absolute pressure sensor.

According to the present invention, the sensor chip is hermetically mounted on the sensor case without enlarging the size of the pressure sensor.

Other objects and features of the present invention will become more readily apparent from a better understanding of the preferred embodiment described below with reference to the following drawings.

DETAILED DESCRIPTION OF THE PREFERRED EMBODIMENT

Figure 1:
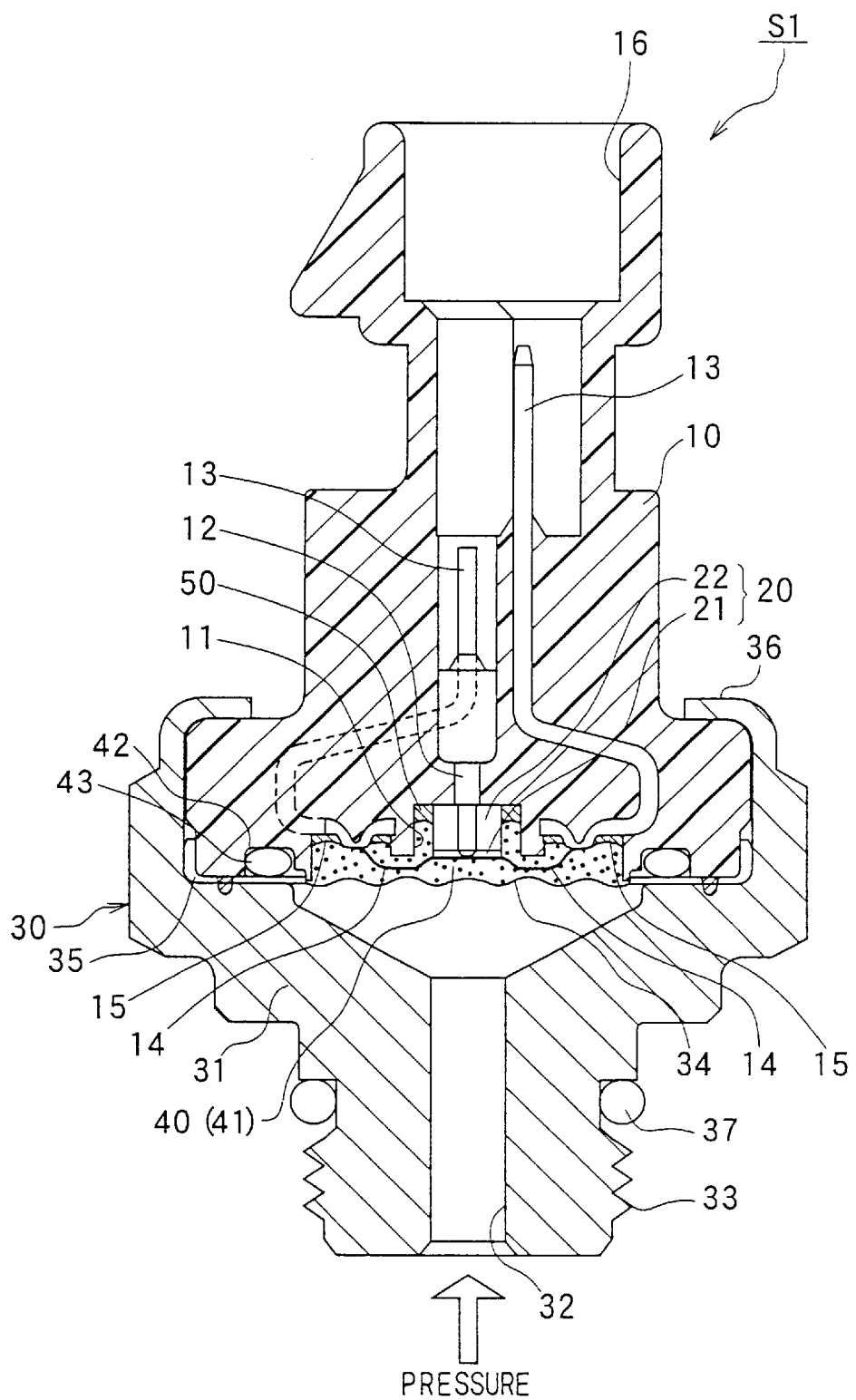
FIG. 1 is a cross-sectional view showing a pressure sensor according to the present invention.

A preferred embodiment of the present invention will be described with reference to FIGS. 1–4. As shown in FIG. 1, a pressure sensor S is composed of a sensor case 10 on which a sensor chip 20 is mounted and a housing 30. The sensor case 10 and the housing 30 are tightly connected to each other by calking. The pressure sensor S1 is used for detecting an engine oil pressure introduced through a pressure-introducing hole 32 formed in the housing 30.

First, a sensor case 10 on which the sensor chip 20 is mounted will be described, mainly referring to FIG. 2. The sensor case 10 is formed in a cylindrical shape by molding a resin material such as PPS (polyphenylene sulfide) or PBT (polybutylene terephthalate). A depressed portion 11 having a depth of about 2.5 mm −3.0 mm is formed on one end surface of the sensor case 10. A through-hole 12 connecting the depressed portion 11 to an outside of the sensor case 10 is formed in the sensor case 10. An atmospheric pressure is introduced in the depressed portion 11 through the through-hole 12. The sensor chip 20 is disposed in the depressed portion 11 to close the through-hole 12 which opens at a bottom surface of the depressed portion 11 (as better seen in FIGS. 3A and 3B).

A front surface (an upward surface in FIG. 2) and a rear surface (a downward surface in FIG. 2) of the sensor chip 20 receive respective pressures imposed thereon, and a pressure difference between the two pressures is detected and converted into an electrical signal. As shown in FIG. 3B, the sensor chip 20 is composed of a diaphragm 21 made of a semiconductor material such as silicon and a substrate 22 made of a material such as glass. The diaphragm 21 and the substrate 22 are connected to each other by anode-welding or the like. The sensor chip 20 is rectangular-shaped as shown in FIG. 3A. The substrate 22 is pasted on the bottom surface of the depressed portion 11 by adhesive such as silicone rubber. The substrate 22 has a center hole through which the pressure introduced from the through-hole 12 is imposed on the rear surface of the diaphragm 21. The rear surface of the diaphragm 21 is also referred to as the rear surface of the sensor chip 20.

Figure 2:
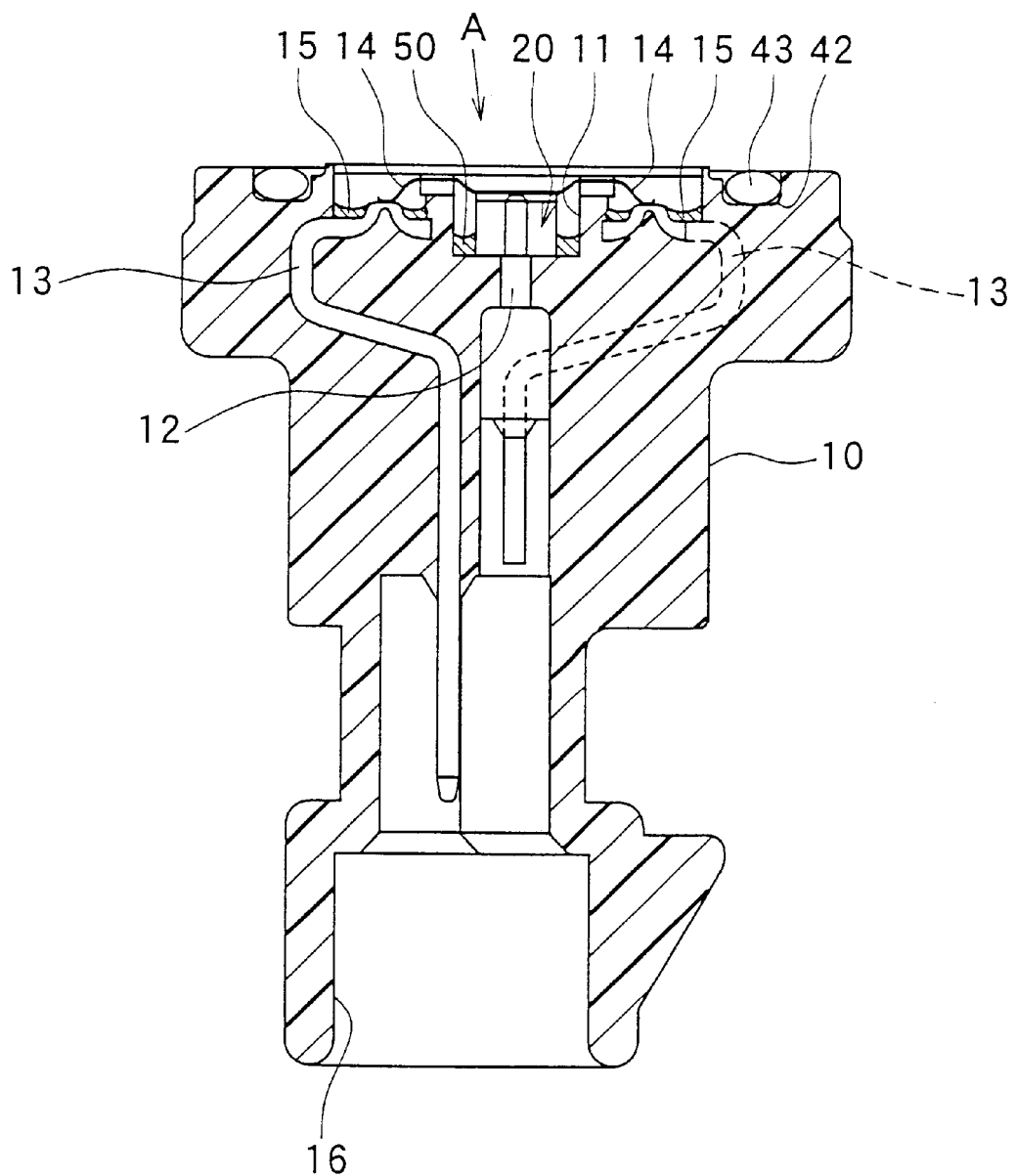
FIG. 2 is a cross-sectional view showing a sensor case, used in the pressure sensor shown in FIG. 1, on which a sensor chip is mounted.
Figure 3A:
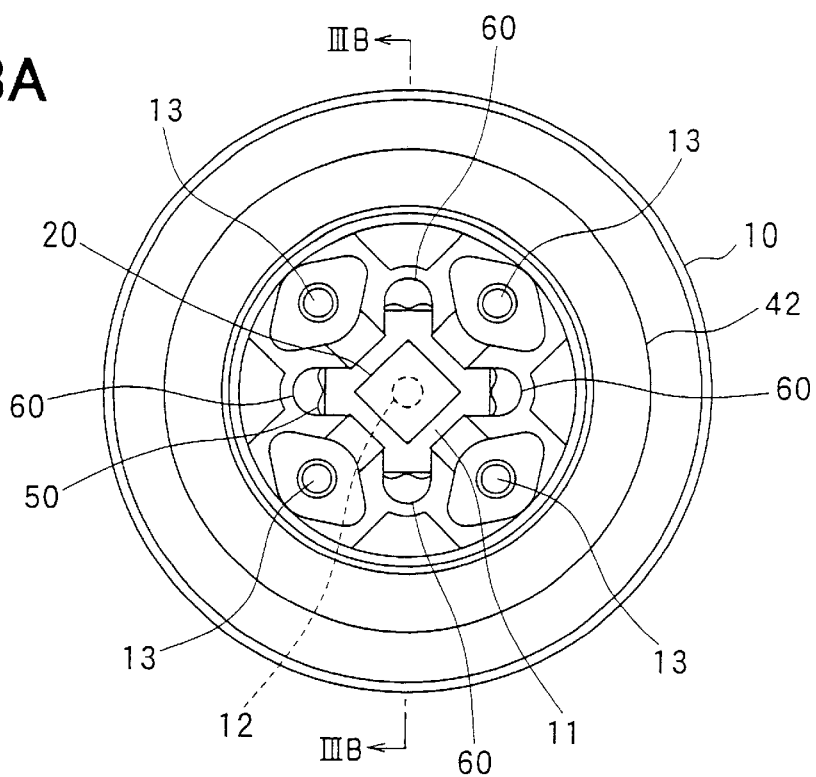
FIG. 3A is a plan view showing one end surface of the sensor case on which the sensor chip is mounted, viewed in direction A shown in FIG. 2.
Figure 3B:
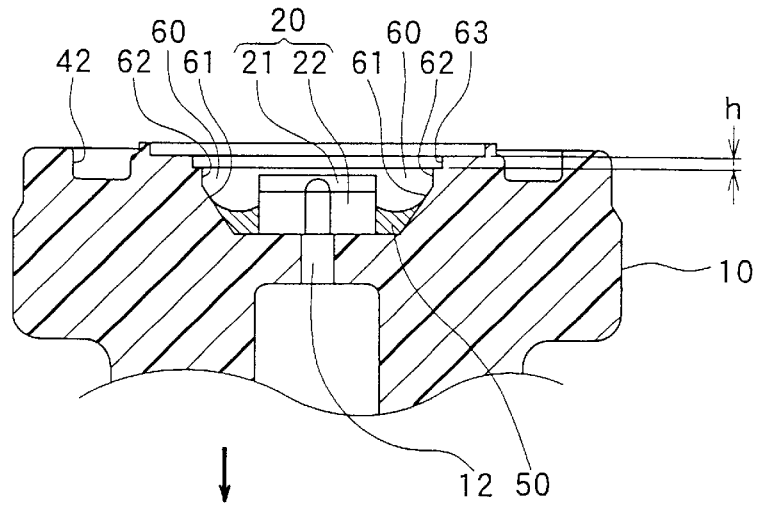
FIG. 3B is a partial cross-sectional view showing a depressed portion of the sensor case in which the sensor chip is disposed, taken along line IIIB—IIIB shown in FIG. 3A.

Terminals 13 electrically connecting the sensor chip 20 to an outside circuit are embedded in the sensor case 10 as shown in FIG. 2 and are positioned around the depressed portion 11 as shown in FIG. 3A. Four terminals 13 are provided in this embodiment, and each terminal 13 is used, for example, as a terminal for inputting a signal to the sensor chip 20, a terminal for outputting a sensor signal, a terminal for grounding, and a terminal for adjusting signals, respectively. The sensor chip 20 is electrically connected via wires 14 formed by wire-bonding to the terminals 13 as shown in FIG. 2. Each front end of the terminals 13 is fixed to the sensor case 10 with a sealing material 15 such as silicone rubber.

A connecting portion 16 is formed at the other end of the sensor case 10. The connecting portion 16 serves to connect the terminals 13 to the outside circuit (an ECU mounted on a vehicle) through a wire-harness (not shown). Communication between the sensor chip 20 and the outside circuit is performed through the wires 14 and the terminals 13.

Referring to FIG. 1 again, an entire structure of the pressure sensor S1 will be described. The housing 30 made of a material such as plated carbon steel includes a housing body 31 and a lip 36 for connecting the housing 30 to the sensor case 10 by calking. The housing body 31 includes a hole 32 for introducing engine oil into the pressure sensor S1 and a screw 33 for mounting the pressure sensor S1 on an oil tank. An O-ring 37 is used to mount the pressure sensor S1 on the oil tank in a fluid-tight manner. A seal diaphragm 34 fixed to a supporting member 35 is disposed between the housing 30 and the sensor case 10 to hermetically close the upper opening of the pressure-introducing hole 32. The seal diaphragm 34 is made of a thin metallic plate such as a SUS plate, and the supporting member 35 is made of a metallic material such as SUS. An outer periphery of the supporting member 35 is welded to the housing body 31.

As shown in FIG. 1, the housing 30 and the sensor case 10 are tightly connected to each other by calking the lip 36. A pressure-detecting chamber 40 is formed between the seal diaphragm 34 and the end surface of the sensor case 10. The pressure-detecting chamber 40 is filled with oil 41 such as fluoric oil which serves to transfer pressure introduced from the hole 32 to the front surface of the sensor chip 20. The oil 41 covers the front surface of the sensor chip 20 and is confined in the pressure-detecting chamber 40 by the seal diaphragm 34.

An O-ring groove 42 is formed surrounding the pressure-detecting chamber 40. An O-ring 43 is disposed in the groove 42 and press-fitted between the sensor case 10 and the seal diaphragm 34 to hermetically seal the pressure-detecting chamber 40.

The pressure sensor S1 structured as described above detects a difference of two pressures in the following manner. The pressure sensor S1 is fixedly connected to a conduit of an engine oil tank to introduce the engine oil into the pressure sensor S1 through the pressure-introducing hole 32. On the other hand, an atmospheric pressure (a first pressure) is introduced into the pressure sensor S1 through the through-hole 12 and imposed on the rear surface of the sensor chip 20. The oil pressure (a second pressure) introduced through the pressure-introducing hole 32 is supplied to the seal diaphragm 34 and imposed on the front surface of the sensor chip 20 via the oil 41 in the pressure-detecting chamber 40. The sensor chip 20 converts the pressure difference between the first pressure and the second pressure into an electric signal. The electric signal is fed to the outside circuit (ECU) through the wires 14 and the terminals 13. Thus, the pressure sensor S1 functions as a relative pressure sensor and detects the oil pressure relative to the atmospheric pressure.

In the pressure sensor S1 functioning as the relative pressure sensor, it is important to prevent pressure leakage from the rear surface of the sensor chip 20 to the front surface. In other words, the sensor chip 20 has to be hermetically bonded to the bottom surface of the depressed portion 11. However, the adhesive bonding the sensor chip 20 to the bottom surface of the depressed portion 11 tends to be unevenly distributed on the bottom surface, thereby causing the pressure leakage. The present invention provides a unique structure to prevent the pressure leakage without fail. The details of the structure for preventing the pressure leakage will be described below.

FIG. 3A shows a front surface of the sensor case 10 where the sensor chip 20 is mounted (viewed in direction A shown in FIG. 2). FIG. 3B shows a cross-sectional view taken along line IIIB—IIIB shown in FIG. 3A. A sealing material 50 is charged in a space between the side periphery of the sensor chip 20 and side walls of the depressed portion 11. The sealing material 50 having liquidity is charged in the space and hardened thereafter. A resin material such as silicone rubber which is hardened at a room temperature may be used as the sealing material 50.

As shown in FIG. 3A, holes 60 for charging the sealing material 50 into the depressed portion 11 are formed around the depressed portion 11. The sensor chip 20 is rectangular-shaped, and the depressed portion 11 is also rectangular-shaped to match the shape of the sensor chip 20. Four charging holes 60 are formed at respective corners of the depressed portion 11, so that each charging hole 60 is positioned between two neighboring terminals 13. As shown in FIG. 3B, the charging hole 60 includes a tapered slope 61 which outwardly enlarges the charging hole 60 and a straight portion 62 standing up from the outer-most position of the tapered slope 61.

Figure 3C:
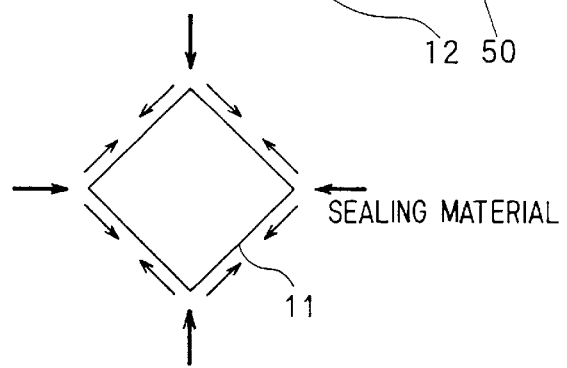
FIG. 3C is a schematic view showing flow directions of a sealing material in a process of supplying the same in the depressed portion.
Figure 4:
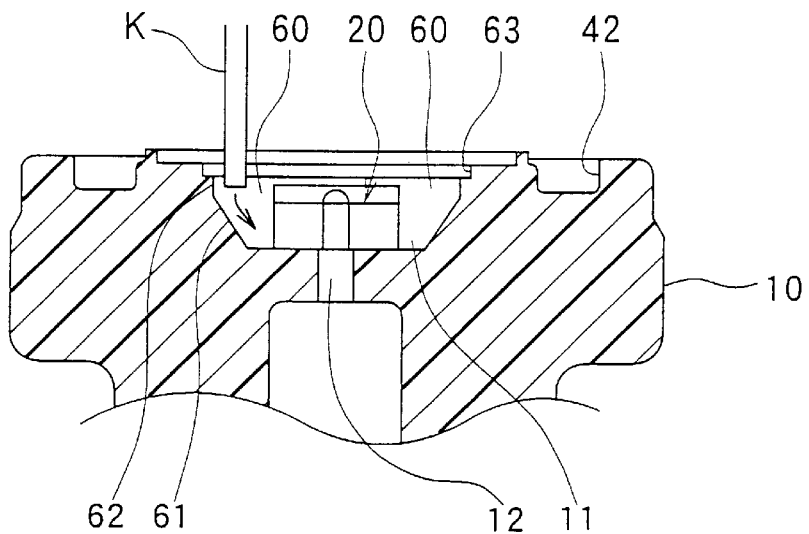
FIG. 4 is a partial cross-sectional view showing a process of supplying the sealing material to the depressed portion.
Figure 5:
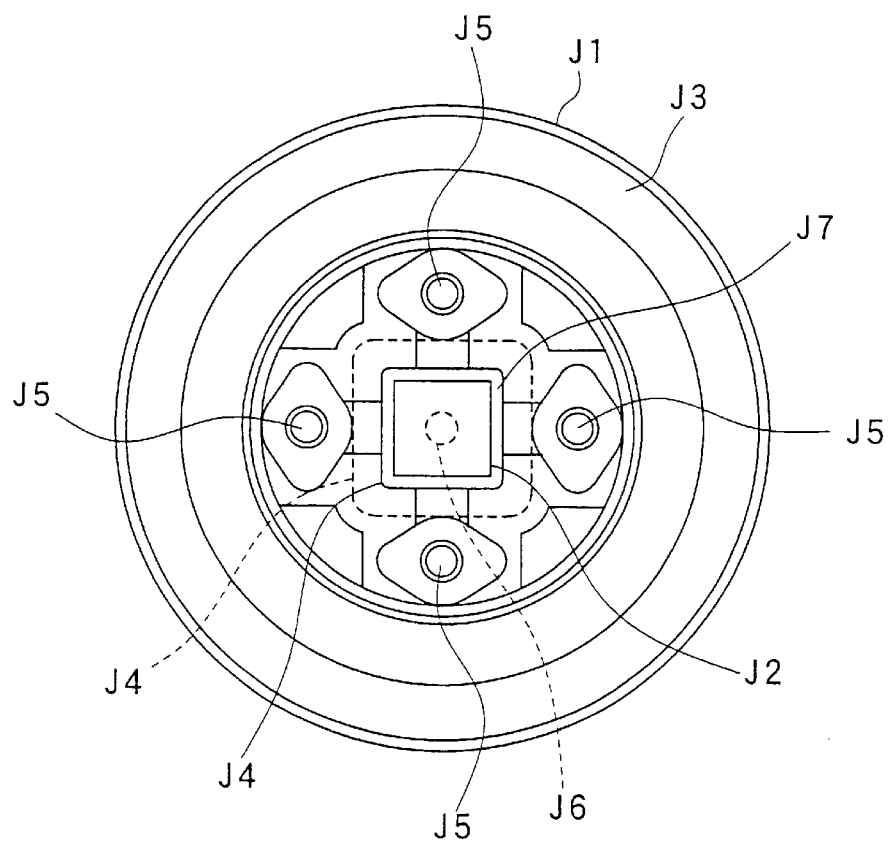
FIG. 5 is a plan view showing one end surface of a sensor case of a proto-type pressure sensor.

The sealing material 50 is charged into the depressed portion 11 from the charging hole 60 in the following manner. After the sensor chip 20 is pasted on the bottom wall of the depressed portion 11, the sealing material 50 is charged from a nozzle K positioned at the straight portion 62, as shown in FIG. 4. For keeping the sensor chip 20 at a correct position on the bottom wall during the process of charging the sealing material 50, the sensor chip 20 may be sucked by a negative pressure supplied from the through-hole 12. The sealing material 50 injected from the nozzle K flows along the tapered slope 61 and fills the space between the side periphery of the sensor chip 20 and the side wall of the depressed portion 11, as shown in FIGS. 3A and 3B. Since the sealing material 50 is supplied from the charging holes 60 positioned at the four corners of the depressed portion 11, the sealing material 50 smoothly flows along the sides of the depressed portion 11, as shown in FIG. 3C. Then, the sealing material 50 is hardened at a room temperature. Alternatively, the sealing material 50 may be hardened by heating or radiating light. Thus, the sensor chip 20 is mounted on the sensor case 10, completing a sensor case subassembly shown in FIG. 2.

Then, the sub-assembly is positioned as shown in FIG. 2 (the front side up), and a predetermined amount of the oil 41 such as fluoric oil or the like is supplied from the top to the upper space of the sensor case 10. On the other hand, the supporting member 35 supporting the diaphragm 34 is welded to the housing 30 at its entire periphery as shown in FIG. 1. Then, the housing 30 is placed on the top of the sensor case 10, and the housing 30 and the sensor case 10 are telescopically coupled to each other. Then, the sensor case 10 coupled with the housing 30 is placed in a vacuum chamber to evacuate air in the pressure-detecting chamber 40.

Then, the sensor case 10 and the housing 30 are firmly pushed to each other so that the pressure-detecting chamber 40 is tightly sealed by the O-ring 42 disposed between the sensor case 10 and the supporting member 35. Then, the lip 36 of the housing 30 is calked to firmly connect the sensor housing 10 and the housing 30 to each other. Thus, the pressure sensor S1 shown in FIG. 1 is completed.

The following advantages are obtained in the pressure sensor according to the present invention. Since the charging holes 60 are formed around the depressed portion 11, the sealing material 50 is properly charged into the space between the sidewall of the depressed portion 11 and the side periphery of the sensor chip 20, thereby realizing a good sealing between the rear and front surfaces of the sensor chip 20. Since the charging holes 60 are formed between the terminals 13, it is not necessary to move the terminals 13 outside. Accordingly, the pressure sensor S1 can be made compact. Since the space in which the oil 41 is supplied is not increased by providing the charging holes 60, the amount of oil 41 is not increased. If a higher amount of oil 41 is used, the sensor characteristics vary in a higher degree according to temperature changes, because a pressure transfer characteristic of the oil 41 is much affected by temperature changes due to its higher heat capacity. Therefore, the temperature-dependency of the pressure sensor can be kept lower according to the present invention.

Since the charging holes 60 are formed at four corners of the depressed portion 11, the sealing material 50 is smoothly charged into the space between the sidewall of the depressed portion 11 and the side periphery of the sensor chip 20. It may be possible to form the charging holes 60 at the sides of the depressed portion 11. In this case, however, the sealing material 50 cannot be sufficiently supplied to the corner portions of the sensor chip 20 because the sealing material 50 does not sufficiently creep up to the corner portions. Since the sealing material 50 is charged from the charging holes 60 positioned at the corners in the embodiment described above, the charging material 50 smoothly flows from the corners to other places, as shown in FIG. 3C. Moreover, the sealing material 50 is sufficiently supplied to the corners of the sensor chip 20. In addition, it is avoided that some of the sealing material 50 adheres to the terminals 13 in a thread-like shape at the end of the charging process, because the charging holes are positioned between the terminals.

Since the tapered slope 61 is formed in the charging hole 60, the sealing material 50 smoothly flows along the tapered slope 61, and an amount of sealing material 50 required to fill the space is saved at the same time. Since the straight portion 62 stands up from the outer-most position of the tapered slope 61, the charging nozzle K can be easily positioned along the straight portion 62. Further, the straight portion 62 serves to prevent the sealing material 50 from creeping up.

A step 63 having a depth "h" is provided at the upper end of the charging port 60 as shown in FIG. 3B. The step 63 further prevents the sealing material 50 from creeping up from the charged space and adhering to the seal diaphragm 34 (FIG. 1). If the sealing material adheres to the seal diaphragm 34, the pressure transfer from the seal diaphragm to the sensor chip 20 is adversely affected. The step 63 performs the above function when the depth "h" is about 50 µm.

The pressure sensor S1 described above detects a pressure difference between the pressures imposed on the rear and front surfaces of the sensor chip 20. The pressure sensor S1 may be used as an absolute pressure sensor that detects the pressure imposed on the rear surface of the sensor chip 20. In this case, a pressure to be measured is imposed on the rear surface of the sensor chip 20 through the through-hole 12. The same advantages of the present invention described above are similarly obtained in the absolute pressure sensor. Though the charging holes 60 are connected to the depressed portion 11 in the embodiment described above, the charging holes 60 may be separated from the depressed portion 11 and connected to the depressed portion 11 through additional passages formed in the sensor case 10.

While the present invention has been shown and described with reference to the foregoing preferred embodiment, it will be apparent to those skilled in the art that changes in form and detail may be made therein without departing from the scope of the invention as defined in the appended claims.

What is claimed is:

1. A pressure sensor comprising:
   a cylindrical sensor case having a depressed portion formed at one longitudinal end, the depressed portion communicating wit a first pressure source through a through-hole formed in the sensor case;
   a sensor chip having a front surface and a rear surface, the sensor chip being mounted in the depressed portion so that the rear surface receives the first pressure supplied from the first pressure source;
   oil disposed in the depressed portion to cover the front surface of the sensor chip;
   a plurality of terminals disposed around the depressed portion for electrically connecting the sensor chip to an outside circuit;
   means for supplying a second pressure from a second pressure source to the oil covering the front surface of the sensor chip, the second pressure being imposed on the front surface of the sensor chip through the oil so that the sensor chip detects a pressure difference between the first and the second pressures;
   a sealing material composed of resin charged in the depressed portion to prevent the first pressure from communicating with the second pressure; and
   a plurality of charging holes for charging the sealing material into the depressed portion, each charging hole being formed between the neighboring two terminals.

2. A pressure sensor comprising:
   a cylindrical sensor case having a depressed portion formed at one longitudinal end, the depressed portion communicating with a first pressure source through a through-hole formed in the sensor case;
   a sensor chip having a front surface and a rear surface, the sensor chip being mounted in the depressed portion so that the rear surface receives the first pressure supplied from the first pressure source;
   oil disposed in the depressed portion to cover the front surface of the sensor chip;
   a plurality of terminals disposed around the depressed portion for electrically connecting the sensor chip to an outside circuit;
   means for supplying a second pressure from a second pressure source to the oil covering the front surface of the sensor chip, the second pressure being imposed on the front surface of the sensor chin through the oil so that the sensor chip detects a pressure difference between the first and the second pressures;
   a sealing material composed of resin charged in the depressed portion to prevent the first pressure from communicating with the second pressure; and
   a plurality of charging holes for charging the sealing material into the depressed portion, each charging hole being formed between the neighboring two terminals, wherein
     the depressed portion and the sensor chip are rectangular-shaped in a plan view, and the sensor chip is positioned in the depressed portion so that sides of the sensor chip are in parallel with sides of the depressed portion; and
     the charging holes are formed at four corners of the depressed portion.

3. The pressure sensor as in claim 2, wherein:
   each of the plurality of charging holes includes a tapered slope that outwardly enlarges each of the plurality of charging holes in an opening direction thereof.

4. A pressure sensor comprising:
   a cylindrical sensor case having a depressed portion formed at one longitudinal end, the depressed portion communicating with a first pressure source through a through-hole formed in the sensor case;
   a sensor chip having a front surface and a rear surface, the sensor chip being mounted in the depressed portion so that the rear surface receives the first pressure supplied from the first pressure source;
   oil disposed in the depressed portion to cover the front surface of the sensor chip;
   a plurality of terminals disposed around the depressed portion for electrically connecting the sensor chip to an outside circuit;
   means for supplying a second pressure from a second pressure source to the oil covering the front surface of the sensor chip, the second pressure being imposed on the front surface of the sensor chip through the oil so that the sensor chip detects a pressure difference between the first and the second pressures;
   a sealing material composed of resin charged in the depressed portion to prevent the first pressure from communicating with the second pressure; and
   plurality of charging holes for charging the sealing material into the depressed portion, each charging hole being formed between the neighboring two terminals, wherein
     the charging holes are formed around the depressed portion at four positions equally spaced.

5. The pressure sensor as in claim 4, wherein:
   a seal diaphragm for confining the oil therein is disposed, so that the second pressure is supplied to the seal diaphragm and transferred to the oil; and
   a step for preventing the sealing material from creeping up from the depressed portion toward the seal diaphragm is provided around each charging hole.

6. The pressure sensor of claim 4, wherein the sensor chip comprises a relative pressure sensor chip.

7. The pressure sensor as in claim 4, wherein:
   each of the plurality of charging holes includes a tapered slope that outwardly enlarges each of the plurality of charging holes in an opening direction thereof.

8. The pressure sensor as in claim 7, wherein:

each of the plurality of charging holes further includes a straight portion that vertically stands up from an outermost position of the tapered slope.

9. A pressure sensor comprising:

a cylindrical sensor case having a depressed portion formed at one longitudinal end, the depressed portion for receiving a first pressure through a through-hole formed in the sensor case;

a sensor chip having a front surface and a rear surface and being mounted in the depressed portion so that the rear surface receives the first pressure;

oil disposed in the depressed portion and covering the front surface of the sensor chip, the oil for receiving a second pressure and conveying the second pressure to the front surface of the sensor chip to enable the sensor chip to detect a pressure difference between the first and the second pressures;

a sealing material for providing a hermetic seal between the front and rear surfaces of the sensor chip; and a plurality of charging holes fir facilitating placement of the hermetic seal between the front and rear surfaces of the sensor chip.

10. The pressure sensor of claim 9, wherein the sensor chip comprises a relative pressure sensor chip.

11. The pressure sensor of claim 9, further comprising a plurality of connecting terminals disposed around the depressed portion and in electrical contact with the sensor chip.

12. The pressure sensor of claim 11, wherein each of the plurality of charging holes is located between adjacent connecting terminals of the plurality of connecting terminals.

\* \* \* \* \*